(12) United States Patent
Kang

(10) Patent No.: US 8,406,074 B2
(45) Date of Patent: Mar. 26, 2013

(54) SEMICONDUCTOR DEVICE

(75) Inventor: Yong-Gu Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 217 days.

(21) Appl. No.: 12/914,164

(22) Filed: Oct. 28, 2010

(65) Prior Publication Data

US 2012/0026821 A1    Feb. 2, 2012

(30) Foreign Application Priority Data

Jul. 30, 2010   (KR) ................. 10-2010-0073933

(51) Int. Cl.
  *G11C 7/00*  (2006.01)
  *G11C 8/00*  (2006.01)
(52) U.S. Cl. .............. 365/222; 365/191; 365/230.03; 365/236
(58) Field of Classification Search .............. 365/191, 365/222, 230.03, 236
See application file for complete search history.

(56) References Cited

U.S. PATENT DOCUMENTS

| | | | |
|---|---|---|---|
| 2002/0191467 A1* | 12/2002 | Matsumoto et al. | 365/222 |
| 2008/0080285 A1* | 4/2008 | Sunwoo et al. | 365/222 |
| 2010/0172200 A1* | 7/2010 | Kawakubo et al. | 365/222 |

FOREIGN PATENT DOCUMENTS

| | | |
|---|---|---|
| KR | 1020020096926 | 12/2002 |
| KR | 1020070036646 | 4/2007 |
| KR | 1020080001973 | 1/2008 |
| KR | 100809960 | 3/2008 |
| KR | 1020090016167 | 2/2009 |

OTHER PUBLICATIONS

Office Action issued by the Korean Intellectual Property Office on Dec. 5, 2011.

* cited by examiner

*Primary Examiner* — Ly D Pham
(74) *Attorney, Agent, or Firm* — IP & T Group LLP

(57) ABSTRACT

A semiconductor device includes a plurality of bank groups including at least two banks, respectively, and a plurality of address counters corresponding to the plurality of bank groups in a one-to-one manner. A refresh operation of a selected bank group is performed in response to a bank group refresh command.

7 Claims, 6 Drawing Sheets

SEMICONDUCTOR DEVICE

CROSS-REFERENCE TO RELATED APPLICATIONS

The present application claims priority of Korean Patent Application No. 10-2010-0073933, filed on Jul. 30, 2010, which is incorporated herein by reference in its entirety.

BACKGROUND OF THE INVENTION

Exemplary embodiments of the present invention relate to a refresh technology of a semiconductor device.

A memory cell of a semiconductor device includes a transistor, serving as a switch, and a capacitor for storing a charge, which represents data. 'High' (a logic value 1) and 'low' (a logic value 0) states of data are determined according to whether charge exists in the capacitor in the memory cell. That is, where the terminal voltage of the capacitor is high, the memory cell is said to store data of a high state, and where the terminal voltage of the capacitor is low, the memory cell is said to store data of a low state.

Since data storage is performed in such a manner that a charge is accumulated in the capacitor, no power consumption occurs principally. However, since the initial amount of charge stored in the capacitor changes due to a leakage current caused by a PN junction of a MOS transistor and the like, data may be lost. In order to prevent such a problem, it is necessary to read data from the memory cell before data is lost and perform a normal recharge operation according to the read information. The storage of data is substantially maintained only when such an operation is periodically repeated. Such a process of recharging a memory cell is referred to as a refresh operation.

In a conventional semiconductor device, if a refresh command is applied to the semiconductor device from a memory controller, all banks in the semiconductor device simultaneously perform the refresh operation. For example, all the word lines 0 to N in banks 0 to 7 are sequentially activated and data is restored.

In the conventional semiconductor device, since all the banks are simultaneously refreshed, a large amount of current is essentially consumed at one time. Furthermore, since all the banks are simultaneously refreshed, operations such as a read operation or a write operation may not be performed during the refresh operation.

SUMMARY OF THE INVENTION

Exemplary embodiments of the present invention are directed to a semiconductor device in which a refresh operation is performed according to bank groups and some of the bank groups not performing the refresh operation may perform operations, such as a read operation or a write operation based on a command.

Another exemplary embodiment of the present invention is directed to reduce current consumption of a semiconductor device by allowing banks in bank groups to be alternately refreshed at the time of a refresh operation of the bank groups.

In accordance with an exemplary embodiment of the present invention, a system for controlling a refresh operation of a plurality of stacked chips includes a semiconductor device including: a plurality of bank groups including at least two banks, respectively, and a plurality of address counters corresponding to the plurality of bank groups in a one-to-one manner, wherein a refresh operation of a selected bank group is performed in response to a bank group refresh command.

When a bank group refresh command is applied, an address counter corresponding to the selected bank group may perform address counting.

When an all bank refresh command is applied, the plurality of address counters may perform address counting and all bank groups may perform a refresh operation.

The bank groups may be selected by bank group addresses.

When the bank group refresh command is applied, the banks in the selected bank group may be sequentially refreshed and when the all bank refresh command is applied, banks in each bank group may be sequentially refreshed.

When the bank group refresh command is applied, the banks in the selected bank group may be simultaneously refreshed, and when the all bank refresh command is applied, all banks in each bank group may be simultaneously refreshed.

A bank group, other than the selected bank group may perform an active, read or write operation according to a command.

Another exemplary embodiment of the present invention is directed to provide a semiconductor device including a plurality of bank groups including at least two banks, respectively, a plurality of address counters corresponding to the plurality of bank groups in a one-to-one manner, and a plurality of address selectors corresponding to the plurality of plurality of address counters in a one-to-one manner, wherein an address selector of a selected bank group selects addresses counted by an address counter in response to a bank group refresh command, and the plurality of address selectors select addresses counted by address counters in response to an all bank refresh command, respectively.

The plurality of address selectors may select addresses inputted from the outside of the semiconductor device in response to an active command.

DESCRIPTION OF SPECIFIC EMBODIMENTS

Figure 1:
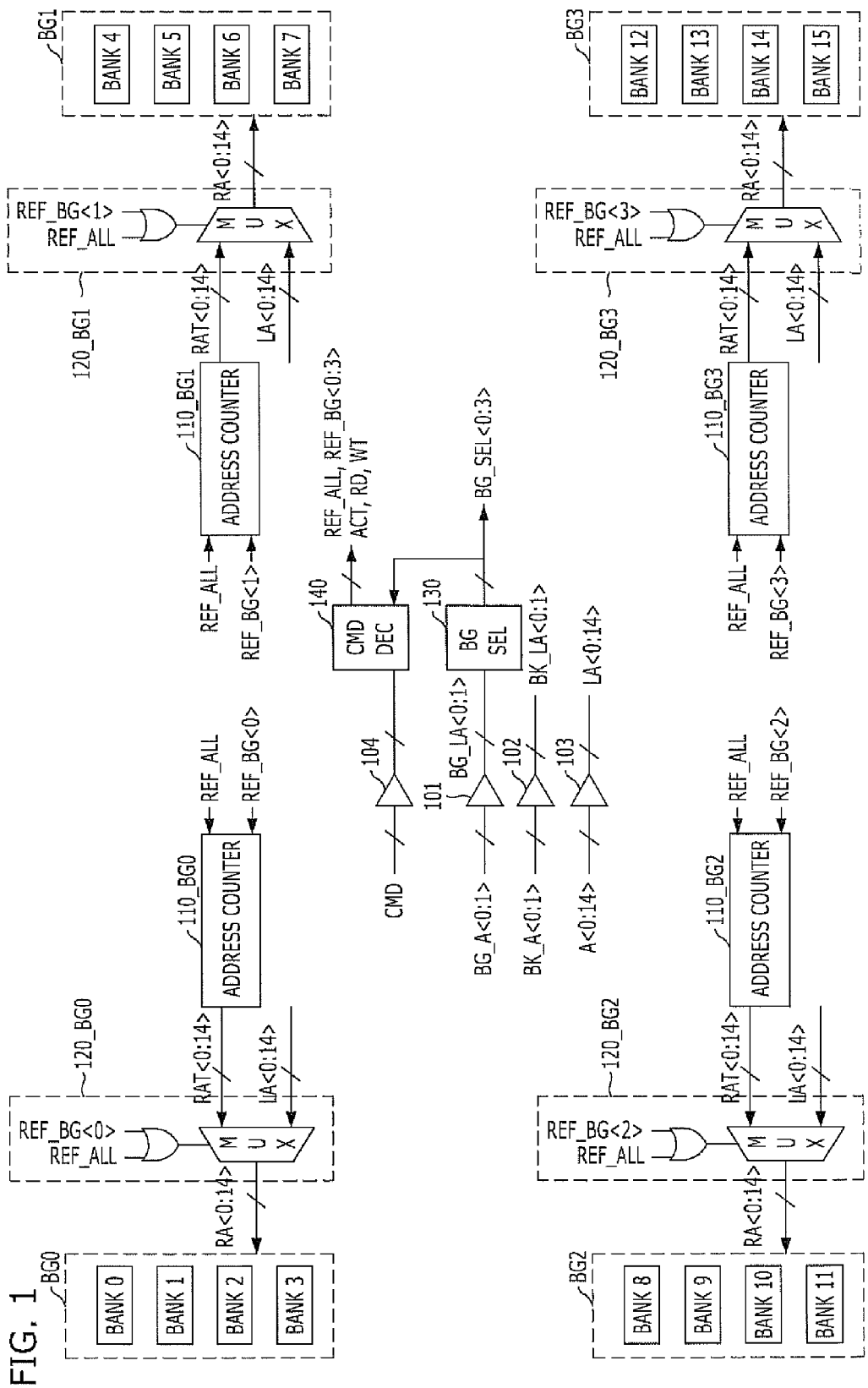
FIG. 1 is a diagram of a semiconductor device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram of a semiconductor device in accordance with an exemplary embodiment of the present invention.

Referring to FIG. 1, the semiconductor device includes a plurality of bank groups BG0 to BG3, a plurality of address counters 110_BG0 to 110_BG3, a plurality of address selectors 120_BG0 to 120_BG3, a bank group selector 130, a command decoder 140, a bank group address buffer 101, a bank address buffer 102, an address buffer 103, and a command buffer 104.

Each of the plurality of bank groups BG0 to BG3 includes at least two banks. The bank groups BG0 to BG3 together form a unit in which a refresh operation is performed by a bank group refresh command. In the exemplary embodiment shown in FIG. 1, the semiconductor device is divided into the four bank groups BG0 to BG3, where bank group BG0 includes four banks BANK0 to BANK3, bank group BG1 includes four banks BANK4 to BANK7, bank group BG2 includes four banks BANK8 to BANK11, and bank group BG3 includes four banks BANK12 to BANK15. Other embodiments may have more or fewer bank groups, including more or fewer banks.

The bank group address buffer 101 is configured to buffer bank group addresses BG_A<0:1> inputted from the outside of the semiconductor device, and latch and output the buffered bank group addresses. In FIG. 1, the latched bank group addresses are indicated by BG_LA<0:1>. Since the latched bank group addresses BG_LA<0:1> are used in the semiconductor device, the latched bank group addresses BG_LA<0:1> hereinafter are referred to as bank group addresses. The bank group addresses BG_LA<0:1> are addresses for selecting one of the plurality of bank groups BG0 to BG3.

The bank address buffer 102 is configured to buffer bank addresses BK_A<0:1> inputted from the outside of the semiconductor device, and latch and output the buffered bank addresses. In FIG. 1, the latched bank addresses are indicated by BK_LA<0:1>. Since the latched bank addresses BK_LA<0:1> are used in the semiconductor device, the latched bank addresses BK_LA<0:1> hereinafter are referred to as bank addresses. The bank addresses BK_LA<0:1> are addresses for selecting one bank from the bank groups BG0 to BG3.

The address buffer 103 is configured to buffer addresses A<0:14> inputted from the outside of the semiconductor device, and latch and output the buffered addresses. In FIG. 1, the latched addresses are indicated by LA<0:14>. Since the latched addresses LA<0:14> are used in the semiconductor device, the latched addresses LA<0:14> hereinafter are referred to as addresses. The addresses LA<0:14> are addresses for selecting word lines to be activated in the banks BANK0 to BANK15.

The command buffer 104 is configured to buffer a command CMD inputted from the outside of the semiconductor device, and transmit the buffered command to the command decoder 140.

The bank group selector 130 is configured to decode the bank group addresses BG_LA<0:1> and select one of the bank groups BG0 to BG3. Bank group selection signals BG_SEL<0:3>, outputted from the bank group selector 130, are activated if a corresponding bank group is selected. For example, if the first bank group BG0 is selected, the bank group selection signal BG_SEL<0> is activated. If the fourth bank group BG3 is selected, the bank group selection signal BG_SEL<3> is activated.

The command decoder 140 is configured to decode the command CMD received from the command buffer 104 and activate an all bank refresh command REF_ALL, bank group refresh commands REF_BG<0:3>, an active command ACT, a read command RD, a write command WT, and the like. The bank group refresh commands REF_BG<0:3> are used for refreshing a bank group selected from the bank groups BG0 to BG3. The command decoder 140 may generate the bank group refresh commands REF_BG<0:3> in response to the command CMD and the bank group selection signals BG_SEL<0:3>. For example, if it is recognized that the bank group refresh command has been applied as a result of the decoding of the command CMD and the bank group selection signal BG_SEL<2> is activated, the command decoder 140 activates the bank group refresh command REF_BG<2> for refreshing the bank group BG2.

The address counters 110_BG0 to 110_BG3 support the bank groups BG0 to BG3 in a one-to-one manner. The address counters 110_BG0 to 110_BG3 are configured to count addresses, if the all bank refresh command REF_ALL is activated or a corresponding bank group refresh command from among the bank group refresh commands REF_BG<0:3> is activated. For example, the address counter 110_BG2 is configured to count addresses if the all bank refresh command REF_ALL is activated or the bank group refresh command REF_BG<2> is activated. Address counting refers to the operation of determining an address by sequentially increasing a value. For example, address counting may be performed to determine the counted addresses RAT<0:14> by sequentially increasing a value from 0 to $2^{14}$.

The address selectors 120_BG0 to 120_BG3 support the bank groups BG0 to BG3 in a one-to-one manner. The address selectors 120_BG0 to 120_BG3 are configured to select the addresses RAT<0:14> counted by the address counters 110_, BG0 to 110_BG3 and transmit the selected addresses RAT<0:14> to the banks in the bank groups BG0 to BG3, respectively, if the all bank refresh command REF_ALL is activated or a corresponding bank group refresh command from among the bank group refresh commands REF_BG<0:3> is activated. Otherwise, the address selectors 120_BG0 to 120_BG3 transmit the addresses LA<0:14> (that is, the addresses received in the address buffer), which are inputted from the outside of the semiconductor device, to the banks in the bank groups BG0 to BG3. Each of the address selectors 120_BG0 to 120_BG3 may include an OR gate and a multiplexer.

The operation of the exemplary embodiment of the present invention is described below. If the all bank refresh command is applied (i.e., REF_ALL is activated), then all the address selectors 120_BG0 to 120_BG3 select the counted addresses RAT<0:14> outputted from the address counters 110_BG0 to 110_BG3, which correspond to the address selectors 120_BG0 to 120_BG3, and transmit the selected addresses RAT<0:14> to the banks BANK0 to BANK3 in the first bank group BG0, the banks BANK4 to BANK5 in the second bank group BG1, the banks BANK8 to BANK11 in the third bank group BG3, and the banks BANK12 to BANK15 in the fourth bank group BG4, respectively. Consequently, in the banks BANK0 to BANK15, word lines are sequentially activated by the counted addresses RAT<0:14> and the refresh operation is performed.

Meanwhile, if the bank group refresh command is applied, the refresh operation is performed only in a bank group selected by the bank group addresses BG_LA<0:1>. For example, if the bank group refresh command is applied and the third bank group BG2 is selected (i.e., REF_BG<2> is activated), the address selector 120_BG2 selects the counted addresses RAT<0:14> outputted from the address counter 110_BG2 and supplies the selected addresses RAT<0:14> to the banks BANK8 to BANK11. Consequently, in the banks BANK8 to BANK11, word lines are sequentially activated and the refresh operation is performed. Further, in the first, second, and fourth bank groups BG0, BG1, and BG3 (i.e., in each of the bank groups other than the third bank group BG2), since the counted addresses RAT<0:14> are not transmitted to the banks BANK0 to BANK7 and BANK12 to BANK15 and the external input addresses LA<0:14> are transmitted to the banks BANK0 to BANK7 and BANK12 to BANK15, the refresh operation is not performed and a separate operation is performed according to external input commands and addresses. That is, regardless of the refresh operation of the third bank group BG2, the first, second, and fourth bank groups BG0, BG1 and BG3 may perform a normal operation.

In FIG. 1, the configuration of a part of the semiconductor device has been omitted for want of space. However, such a configuration will be understood with reference to FIG. 2.

Figure 2:
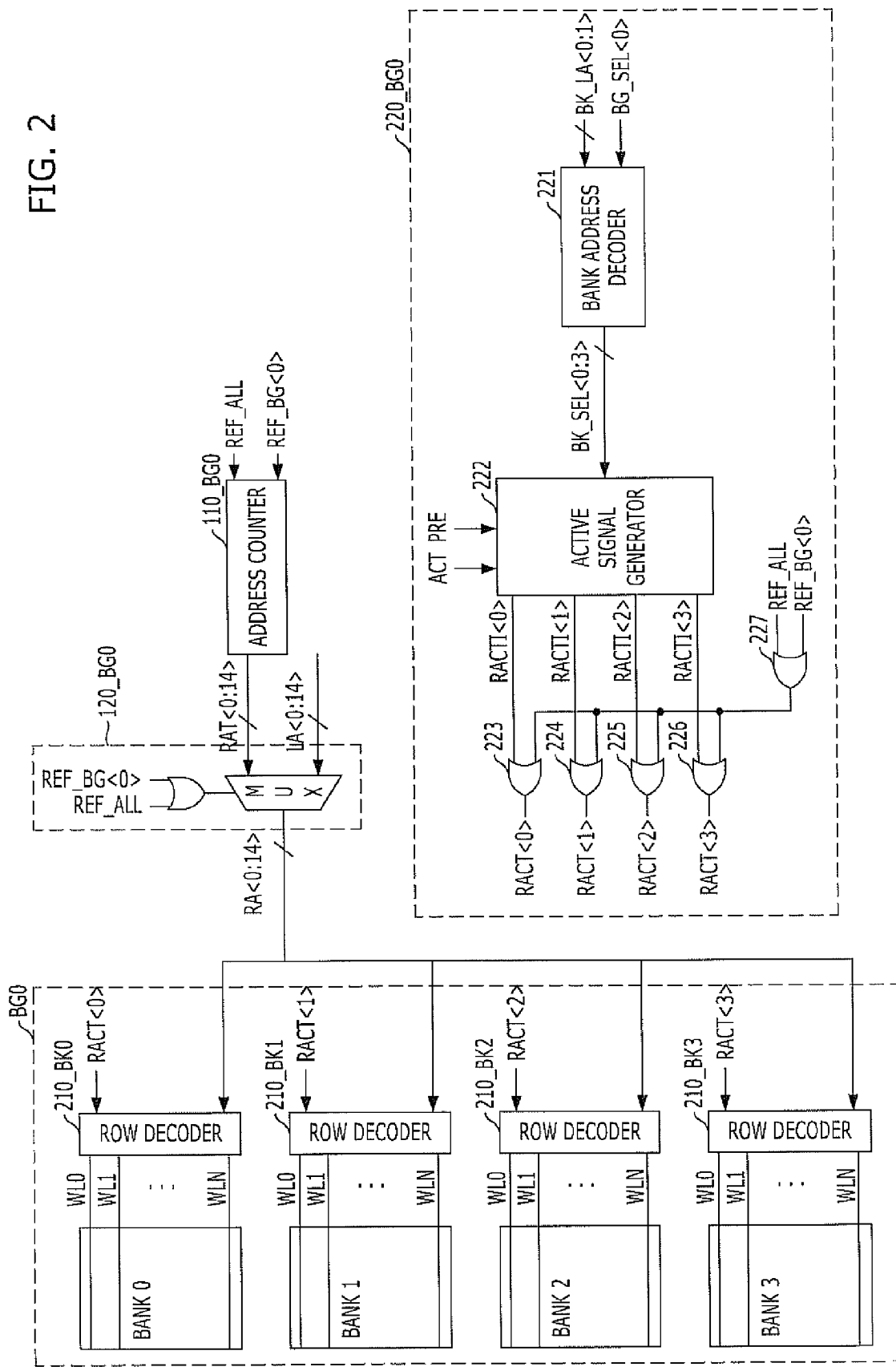
FIG. 2 is a diagram illustrating a configuration of a bank group shown in FIG. 1.

FIG. 2 is a diagram illustrating a configuration of the first bank group shown in FIG. 1.

Referring to FIG. 2, the first bank group BG0 includes row decoders 210_BK0 to 210_BK3 for activating the word lines WL0 to WLN of the banks BANK0 to BANK3, respectively. As shown in FIG. 2, the first bank group BG0 is supported by a bank active circuit 220_BG0 for allowing the banks BANK0 to BANK3 to be in an active state, the address counter 110_BG0, and the address selector 120_BG0.

The bank active circuit 220_BG0 includes a bank address decoder 221, an active signal generator 222, and OR gates 223 to 227. The bank address decoder 221 is configured to decode the bank addresses BK_LA<0:1> and activate one of the bank selection signals BK_SEL<0:3>. The bank address decoder 221 operates only when the bank group selection signal BG_SEL<0> is activated. If the bank group selection signal BG_SEL<0> is deactivated, the bank address decoder 221 outputs the bank selection signals BK_SEL<0:3> in deactivation states. The active signal generator 222 is configured to activate one of the output signals RACTI<0:3> in response to an active signal ACT, which is activated in response to an active command, and the bank selection signals BK_SEL<0:3>, and deactivate the activated output signals RACTI<0:3> in response to a precharge signal PRE, which is activated in response to a precharge command. When no refresh is necessary, the output signals RACTI<0:3> are outputted as bank active signals RACT<0:3> to activate one of the banks BANK0 to BANK3. If the all bank refresh command REF_ALL or the bank group refresh command REF_BG<0> is activated (i.e., one of the outputs of the OR gates 223 to 227 is at a high level), all the bank active signals RACT<0:3> are activated. That is, when the active signal ACT is activated, the bank active circuit 220_BG0 activates one of the bank active signals RACT<0:3> in response to the bank addresses BK_LA<0:1>. At the time of the all bank refresh operation (i.e., where REF_ALL is 'high') or the bank group refresh operation (i.e., where REF_BG<0> is 'high') of the first bank group BG0, the bank active circuit 220_BG0 activates all the bank active signals RACT<0:3>.

The row decoders 210_BK0 to 210_BK3 are configured to decode addresses RA<0:14> received therein and activate one of the word lines WL0 to WLN of the banks BANK0 to BANK3, respectively, if the bank active signals RACT<0:3> received therein are activated.

Since the operations of the address counter 110_BG0 and the address selector 120_BG0 have been described above, description thereof is omitted here.

The second, third, and fourth bank groups BG1 to BG3 may be configured similarly to the case of the first bank group BG0 shown in FIG. 2.

Figure 3:
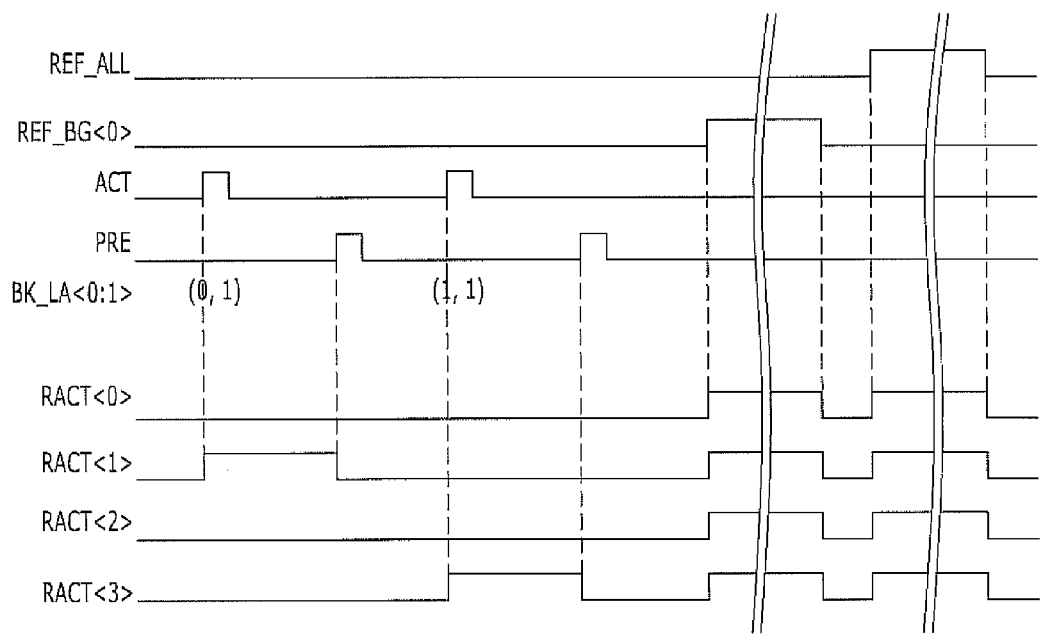
FIG. 3 is a diagram illustrating the operation of the bank group shown in FIG. 2.

FIG. 3 is a diagram illustrating the operation of the first bank group BG0 shown in FIG. 2.

Referring to FIG. 3, when the active signal ACT is first activated, the second bank BANK1 is selected by the bank addresses BK_LA<0:1> (e.g., BK_LA<0:1> may be a two bit signal, such as (0,1)), so that the bank active signal RACT<1> is activated. During the activation period of the bank active signal RACT<1>, the row decoder 210_BK1 activates a word line selected by the addresses LA<0:14>. The bank active signal RACT<1> is deactivated by the activation of the first precharge signal PRE.

When the active signal ACT is secondarily activated, the fourth bank BANK3 is selected by the bank addresses BK_LA<0:1> (e.g., BK_LA<0:1> may be a two bit signal, such as (1,1)), so that the bank active signal RACT<3> is activated. During the activation period of the bank active signal RACT<3>, the row decoder 210_BK3 activates a word line selected by the addresses LA<0:14>. The bank active signal RACT<3> is deactivated by the activation of the precharge signal PRE.

If the bank group refresh command REF_BG<0> is activated, all the bank active signals RACT<0:3> are activated. Furthermore, the addresses RAT<0:14> counted by the address counter 110_BG0 are supplied to the row decoders 210_BK0 to 210_BK3. Consequently, during the activation period of the bank group refresh command REF_BG<0>, the word lines are sequentially activated in the banks BANK0 to BANK3.

As with the case where the bank group refresh command REF_BG<0> is activated, the same operation is also performed during the activation period of the all bank refresh command REF_ALL.

Figure 4:
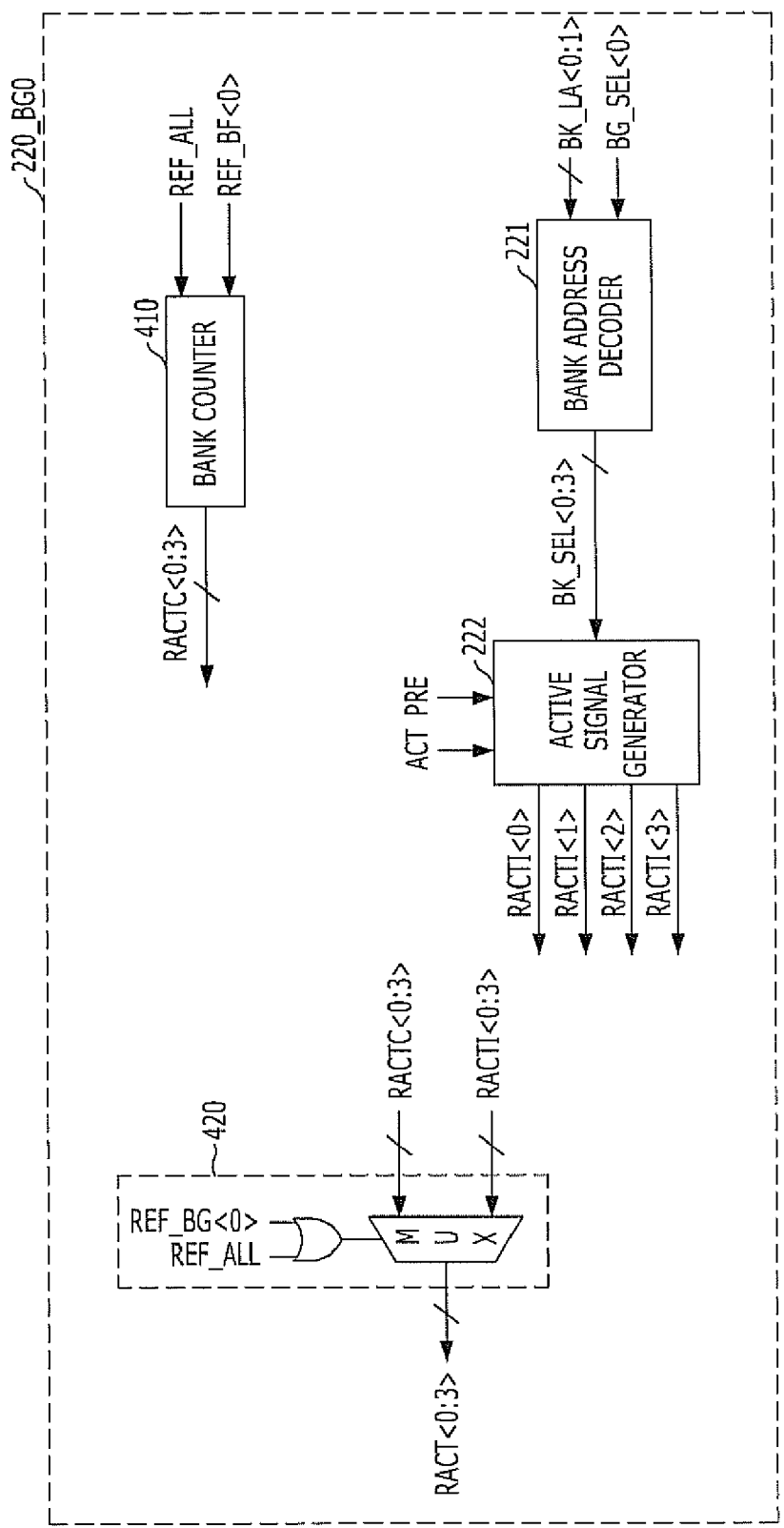
FIG. 4 is a diagram of a bank active circuit shown in FIG. 2 in accordance with another exemplary embodiment.

FIG. 4 is a diagram of the bank active circuit 220_BG0 shown in FIG. 2 in accordance with another exemplary embodiment.

The bank active circuit 220_BG0 shown in FIG. 2 is configured to simultaneously activate the bank active signals RACT<0:3> at the time of the all bank refresh operation and the bank group refresh operation. FIG. 4 shows the bank active circuit 220_BG0 that sequentially activates the bank active signals RACT<0:3> at the time of the all bank refresh operation and the bank group refresh operation.

Referring to FIG. 4, the bank active circuit 220_BG0 in accordance with another exemplary embodiment includes a bank address decoder 221, an active signal generator 222, a bank counter 410, and a selector 420. The bank address decoder 221 and the active signal generator 222 have the same configurations as those of the bank address decoder 221 and the active signal generator 222 shown in FIG. 2. Accordingly, in this exemplary embodiment, the bank counter 410 and the selector 420 are additional elements.

The bank counter 410 is configured to sequentially activate output signals RACTC<0:3>, if the all bank refresh command REF_ALL or the bank group refresh command REF_BG<0> is activated. That is, the output signals of the bank counter 410 are activated in the sequence of RACTC<0>, RACTC<1>, RACTC<2> and RACTC<3>.

The selector 420 is configured to output the output signals RACTC<0:3> of the bank counter 410 as the bank active signals RACT<0:3>, if the all bank refresh command REF_ALL or the bank group refresh command REF_BG<0> is activated, and output the output signals RACTI<0:3> of the active signal generator 222 as the bank active signals RACT<0:3>, if the all bank refresh command REF_ALL and the bank group refresh command REF_BG<0> are deactivated. The selector 420 may include an OR gate and a multiplexer.

At the time of an active operation, the bank active circuit 220_BG0 shown in FIG. 4 operates similarly to the bank active circuit 220_BG0 shown in FIG. 2. However, at the time of a refresh operation in which the all bank refresh command REF_ALL or the bank group refresh command REF_BG<0> is activated, the bank active circuit 220_BG0 sequentially activates the banks BANK0 to BANK3 in the first bank group BG0, so that the banks BANK0 to BANK3 may be sequentially refreshed.

In the case of using the bank active circuit 220_BG0 shown in FIG. 4, since the banks BANK0 to BANK3 are sequentially refreshed, the address counter 110_BG0 counts the addresses RAT<0:14> four different times (i.e., one time for each of the banks BANK0 to BANK3).

Figure 5:
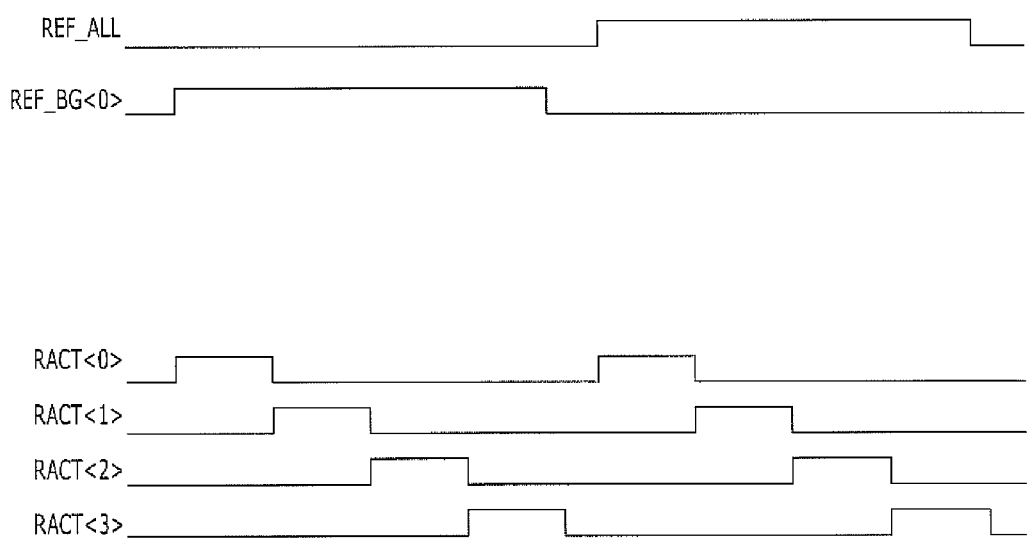
FIG. 5 is a diagram illustrating the operation of the bank group shown in FIG. 2, having the bank active circuit shown in FIG. 4.

FIG. 5 is a diagram illustrating the operation of the bank group BG0 show in FIG. 2, having the bank active circuit 220_BG0 shown in FIG. 4.

Referring to FIG. 5, if the bank group refresh command REF_BG<0> is activated, the bank active signals RACT<0:3> are sequentially activated during the activation period of the bank group refresh command REF_BG<0>. Further, the refresh operation of the first bank BANK0 is performed when the bank active signal RACT<0> is activated, the refresh operation of the second bank BANK1 is performed when the bank active signal RACT<1> is activated, the refresh operation of the third bank BANK2 is performed when the bank active signal RACT<2> is activated, and the refresh operation of the fourth bank BANK3 is performed when the bank active signal RACT<3> is activated. That is, the banks BANK0 to BANK3 are sequentially refreshed in response to corresponding bank active signals RACT<0:3> sequentially activated when the bank group refresh command REF_BG<0> is activated. In the case of FIG. 5, at the time of the refresh operation, since the banks BANK0 to BANK3 are not simultaneously refreshed and are sequentially refreshed, the activation period of the bank group refresh command REF_BG<0> may be controlled to be longer than that in the case of FIG. 3.

During the activation period of the all bank refresh command REF_ALL, the banks BANK0 to BANK3 are sequentially refreshed in a similar manner to the case where the bank group refresh command REF_BG<0> is activated.

When the banks BANK0 to BANK3 are sequentially refreshed as shown in FIG. 5, as compared with the case where the banks BANK0 to BANK3 are simultaneously refreshed as shown in FIG. 3, instantaneous current consumption in the semiconductor device can be further reduced.

FIG. 5 does not show a general active precharge operation. Even when the bank active circuit 220_, BG0 shown in FIG. 4 is used with the configuration shown in FIG. 2, the active precharge operation is performed similarly to the case shown in FIG. 3.

Figure 6:
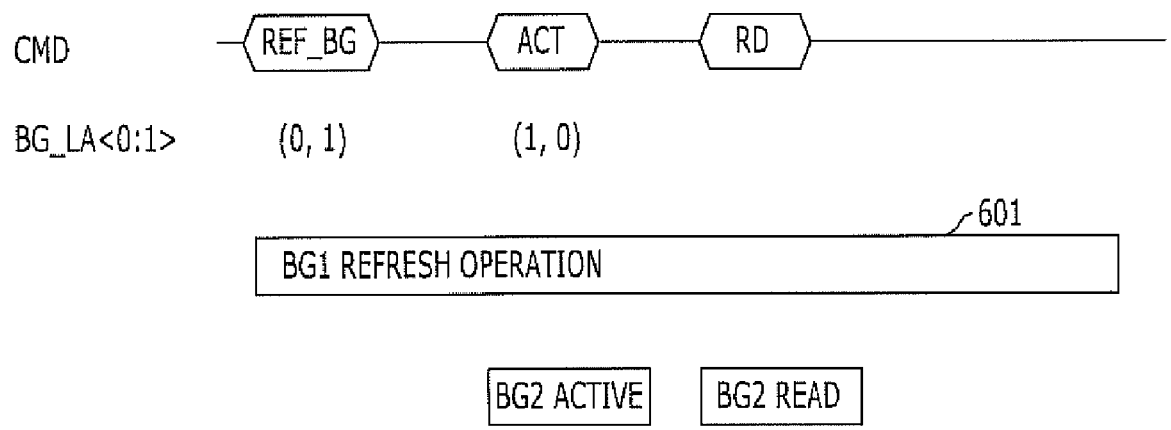
FIG. 6 is a diagram illustrating the case where an individual operation is performed for each bank group in a semiconductor device in accordance with an exemplary embodiment of the present invention.

FIG. 6 is a diagram illustrating the case where an individual operation is performed for each bank group in a semiconductor device in accordance with an exemplary embodiment of the present invention.

Referring to FIG. 6, the second bank group BG1 is selected by the bank group addresses BG_LA<0:1> for designating the second bank group BG1 (e.g., the bank group addresses BG_LA<0:1> may be a two bit signal, such as (0,1)), as well as, the bank group refresh command REF_BG, so that the refresh operation of the second bank group BG1 is performed. In the period 601 for which the refresh operation of the second bank group BG1 is performed, the active command ACT and the read command RD are applied together with the bank group addresses BG_LA<0:1> for designating the third bank group BG2 (e.g., BG_LA<0:1>=(0,1)), so that the active operation and the read operation of the third bank group BG2 are performed.

As described above, in accordance with an exemplary embodiment of the present invention, the address counters 110_BG0 to 110_BG3 are separately provided for the bank groups BG0 to BG3 in a one-to-one manner and the refresh operations of the bank groups BG0 to BG3 are individually performed, so that when a refresh operation of a specific bank group is performed, operations of other bank groups may be normally performed.

In accordance with an exemplary embodiment of the present invention, a refresh operation may be performed only in a bank group selected by a bank group refresh command. Consequently, bank groups, which do not perform the refresh operation, may perform normal operations (a read operation, a write operation and the like).

Furthermore, at the time of the refresh operation, banks in the bank group may be sequentially refreshed, and thus, instantaneous current consumption during the refresh operation may be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a plurality of bank groups including at least two banks, respectively;
   a plurality of address counters corresponding to the plurality of bank groups in a one-to-one manner; and
   a plurality of address selectors, corresponding to the plurality of address counters in a one-to-one manner,
   wherein an address selector of a selected bank group selects addresses counted by an address counter in response to a bank group refresh command, and the plurality of address selectors select addresses counted by address counters in response to an all bank refresh command, respectively.

2. The semiconductor device of claim 1, wherein the plurality of address selectors select addresses inputted from the outside of the semiconductor device in response to an active command.

3. The semiconductor device of claim 2, further comprising a plurality of bank active circuits corresponding to the plurality of bank groups in a one-to-one manner, wherein the plurality of bank active circuits sequentially activate banks of corresponding bank groups, when an all bank refresh command is applied or when a corresponding bank group refresh command is applied.

4. The semiconductor device of claim 2, further comprising a plurality of bank active circuits corresponding to the plurality of bank groups in a one-to-one manner, wherein the plurality of bank active circuits simultaneously activate banks of corresponding bank groups, when an all bank refresh command is applied or when a corresponding bank group refresh command is applied.

5. The semiconductor device of claim 2, wherein, when an active command is applied, a bank active circuit, corresponding to a bank group, which is selected by a bank group address, decodes a bank address and allows one bank of the selected bank group to be in an active state.

6. The semiconductor device of claim 1, wherein, in a period for which a refresh operation of the selected bank group is performed, a bank group, which does not perform the refresh operation, performs an active, read, or write operation according to commands.

7. The semiconductor device of claim 1, wherein, when the bank group refresh command is applied, a bank group is selected by a bank group address.

* * * * *